(12) United States Patent
Anderson et al.

(10) Patent No.: US 10,020,223 B1
(45) Date of Patent: Jul. 10, 2018

(54) REDUCED TIP-TO-TIP AND VIA PITCH AT LINE END

(71) Applicant: INTERNATIONAL BUSINESS MACHINES CORPORATION, Armonk, NY (US)

(72) Inventors: Brent A. Anderson, Jericho, VT (US); Benjamin D. Briggs, Waterford, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/485,394

(22) Filed: Apr. 12, 2017

(51) Int. Cl.
*H01L 21/768* (2006.01)
*H01L 23/522* (2006.01)
*H01L 23/532* (2006.01)
*H01L 23/528* (2006.01)

(52) U.S. Cl.
CPC .. *H01L 21/76816* (2013.01); *H01L 21/76837* (2013.01); *H01L 21/76846* (2013.01); *H01L 21/76849* (2013.01); *H01L 21/76877* (2013.01); *H01L 23/5226* (2013.01); *H01L 23/5283* (2013.01); *H01L 23/53238* (2013.01)

(58) Field of Classification Search
CPC .............. H01L 23/5226; H01L 23/5283; H01L 23/53238
See application file for complete search history.

(56) References Cited

U.S. PATENT DOCUMENTS

| 7,566,652 | B2 * | 7/2009 | Lee | ........................ | H01L 23/522 |
| | | | | | 257/E21.525 |
| 7,960,832 | B2 | 6/2011 | Koerner | | |
| 8,648,592 | B2 * | 2/2014 | Lin | ...................... | H01L 23/5256 |
| | | | | | 324/300 |
| 8,999,767 | B2 | 4/2015 | Burke et al. | | |
| 9,305,879 | B2 | 4/2016 | Filippi et al. | | |
| 9,406,561 | B2 | 8/2016 | Farooq et al. | | |
| 9,449,913 | B2 | 9/2016 | Lee et al. | | |
| 2004/0053501 | A1 * | 3/2004 | Brennan | .............. | H01L 21/7681 |
| | | | | | 438/694 |

(Continued)

OTHER PUBLICATIONS

Brent A. Anderson, et al., Pending U.S. Appl. No. 15/812,119, entitled "Reduced Tip-To-Tip and via Pitch at Line End," filed with the U.S. Patent and Trademark Office Nov. 14, 2017.

(Continued)

*Primary Examiner* — Peniel M Gumedzoe
(74) *Attorney, Agent, or Firm* — Cantor Colburn LLP; Vazken Alexanian

(57) ABSTRACT

A semiconductor structure and methods of forming the semiconductor structure forming a single damascene line formed of a conductive material in a dielectric layer. The single damascene line is at a thickness equal to a line height and a via height. The single damascene line is subtractively cut and patterned to form a first line including a via at a first line end and a second line including a via at a second line end. The tip-to-tip spacing is minimal and defines via pitch. A conformal conductive metal cap layer including cobalt is deposited onto the first and second lines including the respective vias at the first and second line ends.

4 Claims, 7 Drawing Sheets

(56) References Cited

U.S. PATENT DOCUMENTS

| | | | |
|---|---|---|---|
| 2004/0113238 A1* | 6/2004 | Hasunuma | H01L 21/76832 257/636 |
| 2005/0179134 A1* | 8/2005 | Matsubara | H01L 23/5226 257/758 |
| 2008/0171442 A1* | 7/2008 | Wu | H01L 21/76804 438/702 |
| 2009/0152736 A1* | 6/2009 | Watanabe | H01L 21/76831 257/774 |
| 2011/0147936 A1 | 6/2011 | Chu et al. | |

OTHER PUBLICATIONS

List of IBM Patents or Patent Applications Treated as Related; (Appendix P), Date Filed Nov. 14, 2017; 2 pages.

\* cited by examiner

REDUCED TIP-TO-TIP AND VIA PITCH AT LINE END

BACKGROUND

The present invention generally relates to fabrication methods and resulting structures for semiconductor devices. More specifically, the present invention relates to the structure and formation of interconnect structures.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant that is less than silicon dioxide.

SUMMARY

The invention is generally directed to semiconductor structures and methods for forming the semiconductor structures. In one or more embodiments, a method of forming a semiconductor structure on a substrate includes forming a single damascene line in a dielectric layer. The single damascene line is formed of a conductive material and has a thickness equal to a line height and a via height. The single damascene line includes a barrier layer about sidewalls and a bottom surface of the conductive material subtractively cutting and patterning The single damascene line is subtractively cut and patterned to form a first line including a via at a first line end and a second line including a via at a second line end. A conformal conductive metal cap layer including cobalt, ruthenium or an alloy thereof is deposited onto the first and second lines including the respective vias at the first and second line ends.

In one or more embodiments, a method for reducing tip-to-tip spacing and via pitch at line ends includes forming a single damascene line in a dielectric layer, wherein the single damascene line is formed of a conductive material and has a thickness equal to a line height and a via height. The single damascene line includes a barrier layer about sidewalls and a bottom surface of the conductive material. A lithographic stack is provided on the single damascene line, wherein the lithographic stack includes a cap layer, an organic planarizing layer on the cap layer, and a photoresist on the organic planarizing layer. The lithographic stack is patterned to form an opening to the conductive material. The single damascene line is cut by etching the conductive material and the barrier layer to form an undercut relative to the organic planarizing layer and the cap layer, wherein cutting the single damascene line provides the tip to tip spacing between line ends of a first line and a second line. The opening is filled with a gap fill material and provided with a surface coplanar to the organic planarizing layer. The organic planarizing layer is selectively removed to the cap layer, wherein a portion of the gap fill material is above a plane defined by the cap layer. Spacers are formed on each sidewall of the gap filling material. The exposed portions of the cap layer is stripped and the conductive material recessed to form via pillars underlying the spacers, wherein a remaining portion of the recessed conductive material defines a thickness of the first and second lines, and wherein the via pillars are at pitch defined by the tip-to-tip spacing. The spacers and the remaining gap filler material are removed and a conformal metal cap including cobalt is deposited onto the first and second lines including the respective vias at the first and second line ends.

In one or more embodiments, a semiconductor structure includes a first line having a first line end and a second line having a second line end, wherein the first and second lines are linearly arranged relative to one another such that the first line end is spaced apart from the second line end. The first and second lines are formed of a conductive material. Vias are formed of the conductive material at each of the first and second line ends, wherein sidewalls of the first and second line ends are contiguous with a corresponding proximal sidewall of the respective vias. A conformal conductive metal cap layer including cobalt disposed on upper surfaces of the first and second lines, sidewalls defining the first and second line ends, and sidewalls defining the vias.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
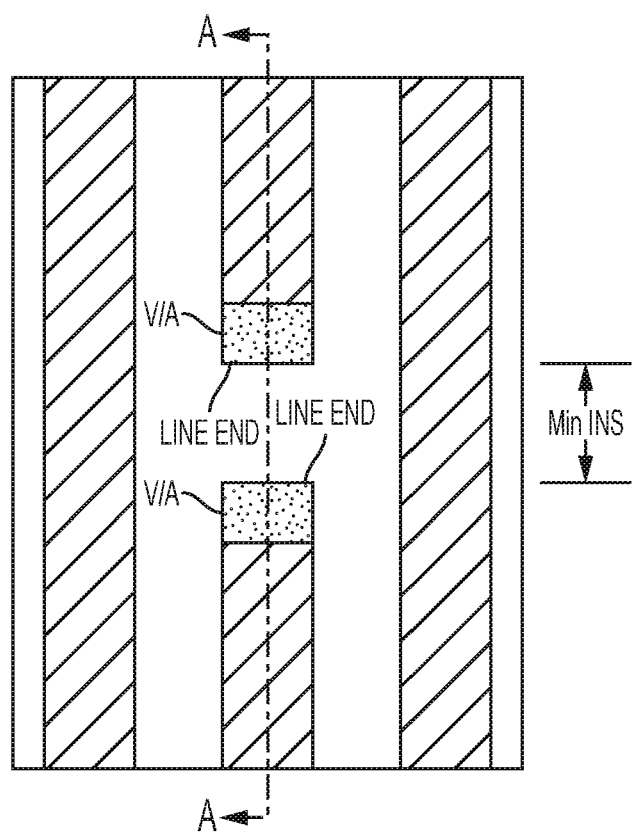
FIG. 1 is a top down view depicting a semiconductor device after a fabrication operation according to embodiments of the invention.

Exemplary embodiments of the invention will now be discussed in further detail with regard to semiconductor devices and methods of manufacturing same and, in particular, to line end cut and via formation at the respective line ends defined by a subtractive process during fabrication of a semiconductor device.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Embodiments of the present invention provide interconnect structures and processes for forming the interconnect structures that generally include reduced tip-to-tip and via pitch at the respective line ends using a subtractive metal process to form the vias. As will be described in greater detail herein, the vias are defined from a cut conductive metal line by the subtractive metal process and self-aligned by a backfill-defined spacer of the cut line. Advantageously, the line end cut is not defined by trench lithography and instead utilizes a recess/backfill process to form the vias.

At present, interconnect structures are typically formed by dual damascene processing as follows: the dielectric material is deposited as a blanket film, lithographically patterned, and then reactive ion etched (RIE), creating both trenches and vias. The pattern is then coated with a refractory metal barrier such as Ta and TaNx followed by a thin sputtered copper seed layer. The seed layer allows for the electrochemical deposition (ECD) of a thick copper layer which fills up the holes. Excessive copper is removed and the surface is planarized by chemical mechanical polishing (CMP). Lastly, a thin dielectric film also known as 'cap' is deposited over the patterned copper lines. This dual damascene process is repeated at each of the higher levels built. However, with respect to line ends, lithography/etch defines the minimum tip to top distance. The orthogonal via pitch is defined by the tip to tip space as defined and the line end extensions need to maintain via contact area. Edge placement errors drive larger tip-to-tip Mx spacing and metal:via line extension.

The present invention overcomes the problems associated with dual damascene metallization processing to form the tip-to-tip spacing between line ends and via pitch at the line end by utilizing a single damascene metallization process to form the conductive line, which is subsequently cut during the subtractive metal process. The resultant structure is shown in the top down structure of FIG. 1, which includes a metal level including a plurality of lines, three of which are shown. One of the lines is defined by linearly arranged first and second lines including line ends, wherein vias are provided at the line ends. The structure advantageously eliminates line end extension resulting from dual damascene metallization processes and has a relatively small tip-to-tip spacing defined only by the minimum insulating material requirement (MinINS) required between the tips, which results in a minimal via pitch. As will be described in greater detail below, a subtractive cutting and patterning process can be applied to a single damascene line of conductive material to form a first line including a via at a first line end and a second line including a via at a second line end as shown, wherein the line end cut of the single damascene line is not defined by the trench lithography step.

Figure 2:
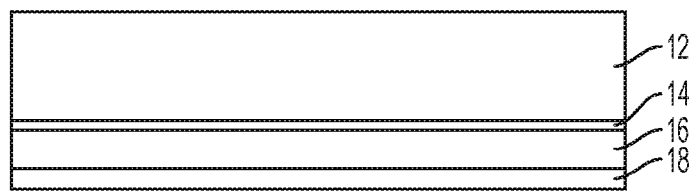
FIG. 2 is a sectional view depicting a semiconductor device after a fabrication operation according to embodiments of the invention.

Referring to FIG. 2, there is depicted an initial structure 10 that can be used to form the structure of FIG. 1 that can be employed in one or more embodiments of the present invention. The initial structure 10 includes at least one region of a conductive material 12, i.e., a metal conductor, which is utilized to form of a metal line of a defined length. The conductive material is typically embedded within a dielectric layer (not shown) and is formed by a single damascene process.

A barrier layer 14 is first deposited and lines a trench opening formed by the single damascene process to prevent electromigration of the conductive material 12. The conductive material 12 has an upper surface that is coplanar with an upper surface of the dielectric layer. The barrier layer 14 that is within the each of these trench openings has a U-shaped cross section. The term "U-shaped" as used throughout the present invention denotes any contiguous material such as the barrier layer 14 that includes two vertical portions which upwardly extend from a horizontal connecting portion. Because an oblique sectional view is depicted, the barrier layer is shown intermediate a ultra-low k dielectric layer 16 and the conductive material 12

The conductive material 12 is at a thickness representing a metal level (Mx) and an upper via level (Vx+1) of an interconnect structure, i.e., Mx+Vx+1.

As shown, the conductive material 12, barrier layer 14 and dielectric material are formed on an ultra-low k dielectric material 16 overlaying a cap layer 18. These layers 12, 14, 16, and 18 along with the dielectric layer (not shown) are provided on a substrate (not shown in the drawings of the present application).

The conductive material 12 can include Al, W, Cu Ru, Co, Ir, and/or a Cu alloy (such as AlCu, CuMn, CuTi, or the like) formed by a deposition process including, for example, CVD, PECVD, PVD, sputtering, plating, chemical solution deposition and electroless plating.

The barrier layer 14 can include any material that can serve as a barrier to prevent conductive material ions from diffusing into the dielectric material 12. Examples of materials that can be used as diffusion barrier 14 include, for example, Ta, TaN, Ti, TiN, Ru, RuN, RuTa, RuTaN, IrTa, IrTaN, W, WN or a multilayered stack thereof. The thickness of the diffusion barrier 14 can vary depending on the deposition process used as well as the material employed. Typically, the barrier layer 14 has a thickness from 4 nm to 40 nm, with a thickness from 7 nm to 20 nm being more typical. The barrier layer 14 can be formed by a deposition process including, for example, CVD, PECVD, PVD, sputtering and plating.

In one or more embodiments, liner layers (not shown), such as, for example, cobalt, ruthenium, alloys thereof such as CoTi, or the like can be positioned between the barrier layer 14 and the conductive metal 12. For example, cobalt can be present in thin layers as a liner layer (e.g., 1 to 100 angstroms) between a TaN barrier layer, and the conductive metal 12.

The dielectric material of the initial structure can include any interlevel or intralevel dielectric material (ILD) including inorganic dielectrics or organic dielectrics. The dielectric material can be porous, non-porous or contain regions and/or surfaces that are porous and other regions and/or surfaces that can be non-porous. Some examples of suitable dielectrics that can be used as the dielectric material include, but are not limited to, silsesquioxanes, C doped oxides (i.e., organosilicates) that include atoms of Si, C, O and H, thermosetting polyarylene ethers, polyimides, polynorbornene, benzocyclobutene, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one or more embodiments, the dielectric material has a dielectric constant that is less than silicon dioxide, i.e., less than 4.0. In another embodiment, the dielectric material that can be employed in the present invention has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0. The dielectric material can be formed utilizing a deposition process such as, for example, chemical vapor deposition (CVD), plasma enhanced chemical vapor deposition (PECVD), evaporation, chemical solution deposition and spin-on coating.

The ultra-low k dielectric layer 16 can include one or more layers of an insulating material. Insulating materials typically include pure or doped silicate glasses with the doping being fluorine or carbon; carbon-doped silicon oxide (SiCOH), silsesquioxanes, siloxanes, or other dielectric materials. The insulating materials can be porous. In one or more embodiments, the ultra-low k dielectric layer 16 has a dielectric constant less than 4.

The cap layer 18 can be an insulating material containing nitrogen. In one or more embodiments, the cap layer 18 can be SiCN, SiCNH, SiC, or SiNO.

The substrate upon which the interconnect is formed, which is not shown, can include a semiconducting material, an insulating material, a conductive material or any combination including multilayers thereof. When the substrate includes a semiconducting material, any semiconductor such as, for example, Si, SiGe, SiGeC, SiC, Ge alloys, GaAs, InAs, InP and other III/V or II/VI compound semiconductors can be used. In addition to these listed types of semiconducting materials, the semiconductor substrate can be a layered semiconductor such as, for example, Si/SiGe, Si/SiC, silicon-on-insulators (SOIs) or silicon germanium-on-insulators (SGOIs). In one or more embodiments, the semiconducting material can include one or more semiconductor devices such as, for example, complementary metal oxide semiconductor (CMOS) devices fabricated thereon.

When the substrate is an insulating material, the insulating material can be an organic insulator, an inorganic insulator or a combination thereof including multilayers. When the substrate is a conducting material, the substrate can include, for example, polySi, an elemental metal, alloys of elemental metals, a metal silicide, a metal nitride or combinations thereof including multilayers.

When the substrate includes a combination of an insulating material and a conductive material, the substrate can represent one of interconnect levels of a multilayered interconnect structure.

The single damascene process for forming the line of the conductive material 12 in the trench generally includes a lithographic step that can include forming a photoresist (organic, inorganic or hybrid) atop the dielectric material. The photoresist can be formed utilizing a deposition process such as, for example, CVD, PECVD and spin-on coating. Following formation of the photoresist, the photoresist is exposed to a desired pattern of radiation to form at least one trench. Next, the exposed photoresist is developed utilizing a conventional resist development process. After the development step, an etching step can be performed to transfer the pattern from the patterned photoresist into at least the dielectric material. The etching step used in forming the at least one trench opening can include a dry etching process (including, for example, reactive ion etching, ion beam etching, plasma etching or laser ablation), a wet chemical etching process or any combination thereof. In one embodiment, reactive ion etching is used to form the at least one opening.

Each trench opening that is formed in the dielectric material is then filled with a barrier layer 14 and the conductive material 12 as shown.

After deposition of each of the barrier layer 14 and the conductive material 12 into the trench opening, any excess diffusion barrier material and conductive material that is located outside of the at least one opening can be removed by a planarization process. In one embodiment, the planarization process includes chemical mechanical polishing (CMP). In another embodiment, the planarization process includes grinding. In a further embodiment, the planarization process includes a combination of CMP and grinding. In some embodiments and when a hard mask material is employed, the planarization process also removes remaining portions of the hard mask material that may be located outside the opening and on the upper surface of dielectric materials. Consequently, the initial structure 10 includes a planar top surface as shown.

Figure 3:
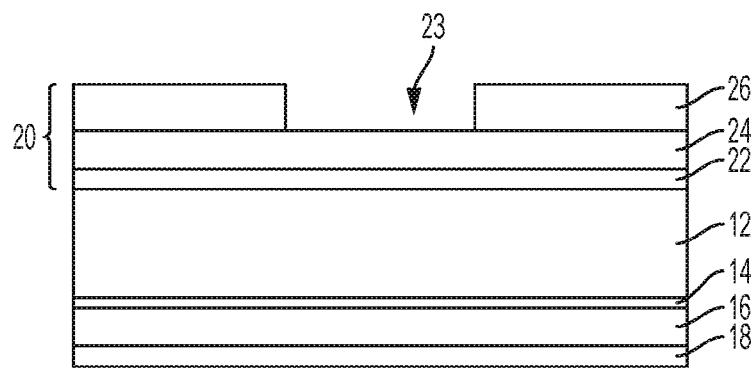
FIG. 3 is a sectional view depicting a semiconductor device after a fabrication operation according to embodiments of the invention.

In FIG. 3, a lithographic stack 20 is deposited onto the conductive material 12. The lithographic stack includes a cap layer 22, an organic planarizing layer (OPL) 24, and a photoresist layer 26. The photoresist as shown is patterned and opens the underlying OPL layer 24. As will be described in greater detail below, the opening 23 will be used to define the minimum insulator spacing between line ends.

The cap layer 22 can be deposited at a thickness of about 10 nanometers (nm) to about 100 nm. The cap layer can be a sacrificial nitride material. In one or more embodiments, the cap layer 22 is SiCN or SiN.

The organic planarizing layer 24 is typically a carbon based material having a dielectric constant of about 4.0 or less. In one or more embodiments, the dielectric constant is less than about 3.0. Exemplary materials defining the organic planarizing layer that can be employed in the invention include, but are not limited to: diamond-like carbon (DLC), fluorinated DLC, polyimides, fluorinated polyimides, parylene-N, parylene-F, benzocyclobutanes, poly(arylene ethers), polytetrafluoroethylene (PTFE) derivatives marketed by Du Pont de Nemours, Inc. under the registered trademark Teflon AF, poly(naphthalenes), poly (norbornenes), foams of polyimides, organic xerogels, porous PTFE and other nano-, micro- or macro-porous organic materials.

The organic dielectric material can formed on the surface of substrate using conventional deposition techniques as generally discussed above. For example, chemical vapor deposition, plasma vapor deposition, sputtering, dip coating, spin-on coating, brushing, spraying and other like deposition techniques can be employed. The resultant organic dielectric layer preferably has a thickness of about 500 (Å) Angstroms to 10,000 Å, more preferably, about 2000 Å to 9000 Å.

The photoresist 26 is not intended to be limited and can be organic base, inorganic based or a hybrid thereof. The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process to form the opening as shown.

Figure 4:
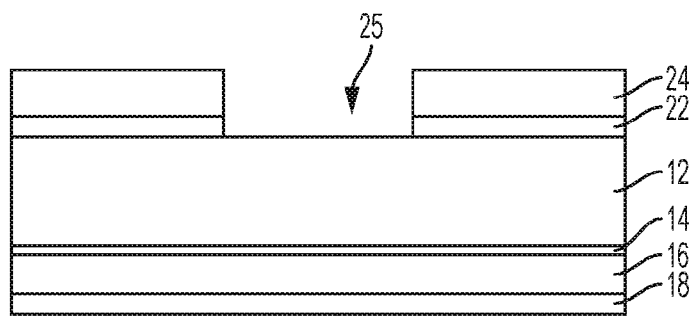
FIG. 4 is a sectional view depicting a semiconductor device after a fabrication operation according to embodiments of the invention.

In FIG. 4, the photoresist pattern is transferred to the underlying layers to the conductive metal layer 12 using an etch process. In one or more embodiments, the etch process for removing the exposed OPL 24 and cap layer 22 can act as a resist ashing, so no additional ashing of the photoresist would be needed. The etching step used in forming the at least one opening 25 in the OPL 24 and cap layer 22 can include a dry etching process (including, for example, reactive ion etching, ion beam etching, plasma etching or laser ablation), a wet chemical etching process or any combination thereof. In one or more embodiments, reactive ion etching is used to form the opening 25 in the OPL 24 and the cap layer 22.

Figure 5:
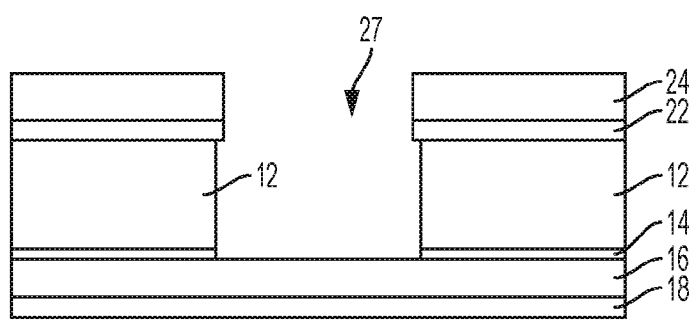
FIG. 5 is a sectional view depicting a semiconductor device after a fabrication operation according to embodiments of the invention.

In FIG. 5, a plasma or ion beam is then used to anisotropically etch the exposed conductive metal layer 12 to form opening 27. A wet etch selective to the barrier layer 14 (and liner, if present) is then applied to remove the exposed barrier layer 14 and provide minimal undercut. The opening 27 defines the tip-to-tip spacing between the line ends of conductive material 12.

Figure 6:
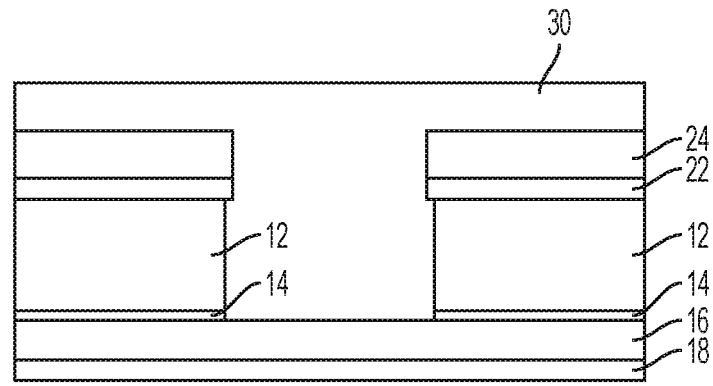
FIG. 6 is a sectional view depicting a semiconductor device after a fabrication operation according to embodiments of the invention.

In FIG. 6, a gap fill planarization material 30 is deposited into the opening. The gap fill material is not intended to limited and can generally include an amorphous carbon layer. An exemplary gap fill material suitable for use is an organosiloxane polymer commercially available under the trade name DUO from Honeywell. An excess amount of the gap fill material 30 is applied and fills the opening 27.

Figure 7:
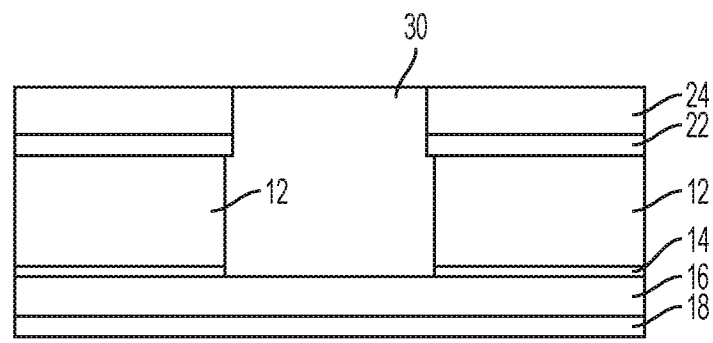
FIG. 7 is a sectional view depicting a semiconductor device after a fabrication operation according to embodiments of the invention.

In FIG. 7, an etch back process is utilized to remove the excess amount of the gap fill material to the OPL 24. A CMP process can then planarize the surface to the organic planarization layer such that the OPL 24 is coplanar to the gap fill planarization material 30.

Figure 8:
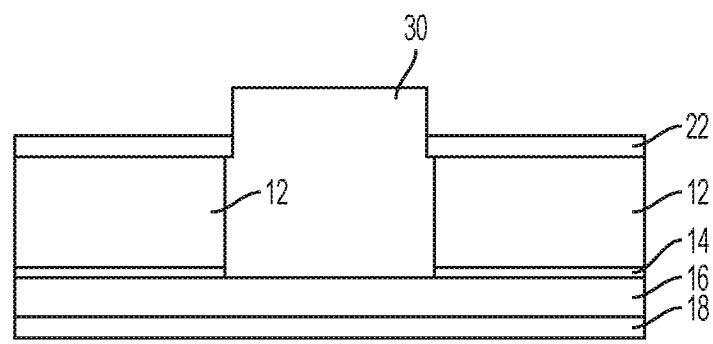
FIG. 8 is a sectional view depicting a semiconductor device after a fabrication operation according to embodiments of the invention.

In FIG. 8, the OPL 24 is selectively stripped from the substrate using the cap layer 22 as an etch stop. For example, the OPL 24 can be selectively removed using an oxygen plasma stripping process.

Figure 9:
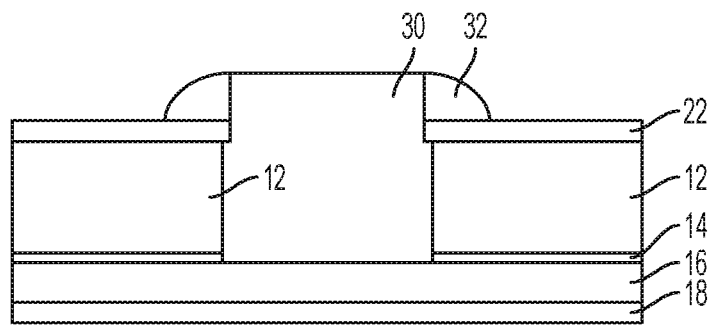
FIG. 9 is a sectional view depicting a semiconductor device after a fabrication operation according to embodiments of the invention.

In FIG. 9, spacers 32 are formed on sidewalls of the gap filling material 30. Conformal deposition of a nitride or oxide followed by reactive ion etching can be used to create the spacers. The spacers 32 will later be used define the critical dimensions of the line end vias by subtractive etching of the conductive material 12. Vias not at line end can be block patterned in a similar manner.

Figure 10:
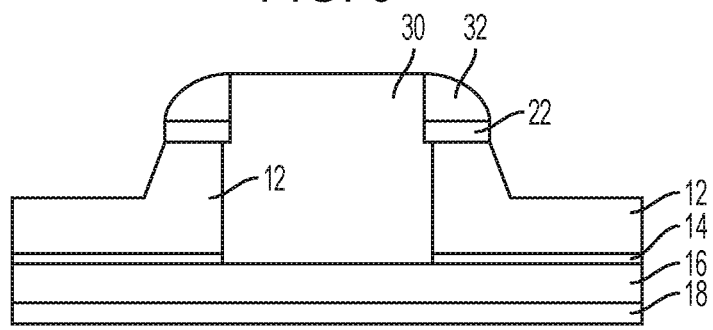
FIG. 10 is a sectional view depicting a semiconductor device after a fabrication operation according to embodiments of the invention.

In FIG. 10, the exposed portions of the cap layer 22 are removed. By way of example, the cap layer 22 can be removed by dilute hydrofluoric acid. The exposed conductive material 12 is then recessed by an etch process such as ion beam or reaction ion etch so as to form pillars at the end of each respective line. The pillars define the upper vias (Vx+1) of the metal line level (Mx). The amount of conductive material 12 remaining (adjacent the via) defines the thickness of the conductive line. As previously discussed, the thickness of the conductive material 12 as initially deposited represents both the metal level (Mx) and the upper via level (Vx+1) of the interconnect structure, i.e., Mx+Vx+1. That is, both the vias and the cut lines are formed from the same conductive material using a backfill-defined spacer of the cut line and a subtractive etch process. The backfill-defined spacers 32 (see FIG. 9) permit the etch process to selectively remove a portion of the conductive material 12 located away from the line ends reducing the thickness therein such that the resulting vias at the line end, which were protected during the etching process by the spacer 32, have a vertical sidewall 50 contiguous with the line end and an opposing sloped sidewall 52 as shown.

Figure 11:
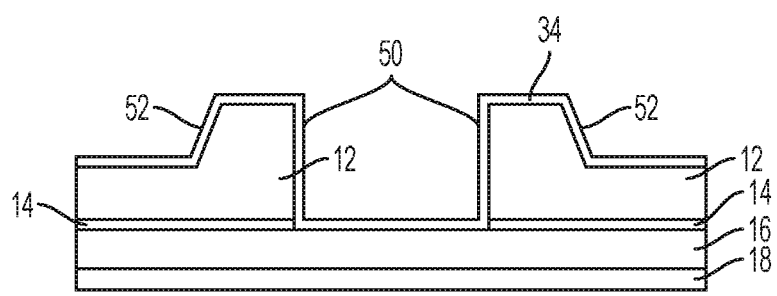
FIG. 11 is a sectional view depicting a semiconductor device after a fabrication operation according to embodiments of the invention.

In FIG. 11, the spacers 32 are stripped and the gap fill material 30 is selectively removed from the substrate. A cap layer 34 including a conductive metal is then conformally deposited. The cap layer can prevent electromigration of the conductive material 12. In one or more embodiments, the conformal cap layer is a bilayer of selectively deposited metal and a non-selective insulator. By way of example, the selective metal can include cobalt, ruthenium, or alloys thereof such as CoTi, and is deposited onto the exposed metal surfaces. The non-selective insulator can be SiCN and overlays the cap layer.

Figure 12:
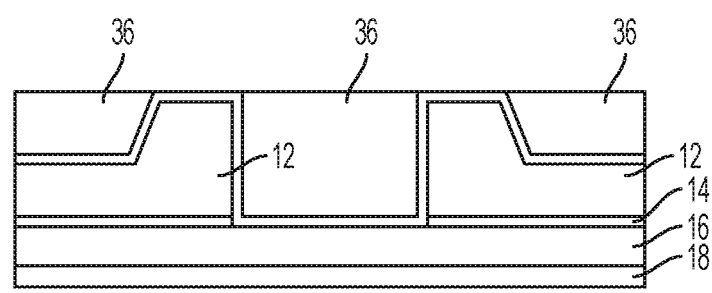
FIG. 12 is a sectional view representative of the structure taken along lines A-A of FIG. 1 depicting a semiconductor device after a fabrication operation according to embodiments of the invention.

In FIG. 12, a low k dielectric layer 36 is then deposited onto the structure 10. The low k dielectric layer is not intended to be limited and can be a spin-on or flowable gap fill low k dielectric material. A planarization process such as CMP is then used to remove overfill excess and planarize the surface to the via top surface cap layer. In the event that a flowable or spin on material with gap/topography filling capabilities is not used than a typical PE-CVD low-k deposition in a Deposition/Etch/Deposition sequence can be used to fill gaps. Alternatively 36 and 40 can be the same material deposited in a single step. FIG. 12 is representative of FIG. 1 taken along lines A-A.

Figure 13:
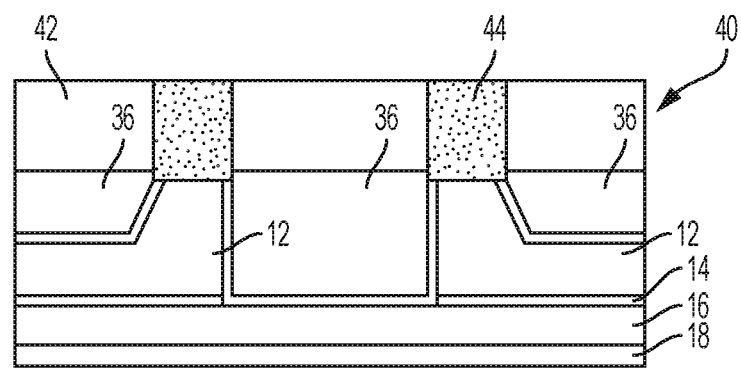
FIG. 13 is a sectional view depicting a semiconductor device after a fabrication operation according to embodiments of the invention.

In FIG. 13, the process flow is continued with formation of the next metal line 40, i.e., Mx+1 layer. The formation generally includes deposition and patterning of a dielectric material 42, exposing the conductive metal 12 by selectively etching the cap layer 34, and deposition of a conductive material 44 on the exposed conductive metal 12, i.e., the underlying line end vias formed as described above.

In one or more other embodiments, the line end via process generally includes patterning of a merged top via and a tip-to-tip cut of the merged top vias as shown in FIGS. 14-21.

Figure 14:
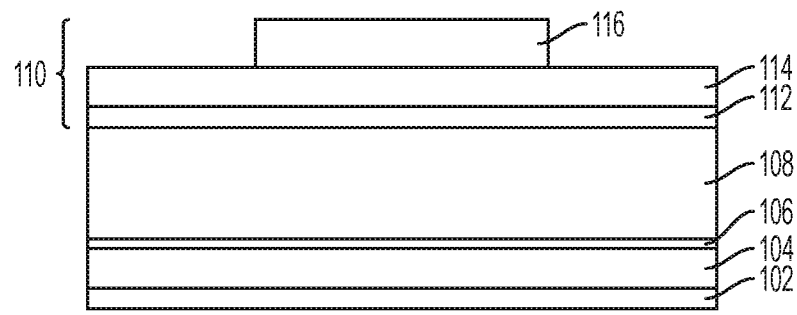
FIG. 14 is a sectional view depicting a semiconductor device after a fabrication operation according to embodiments of the invention.

In FIG. 14, the initial structure 100 includes a conductive metal 108 embedded in a trench formed in a dielectric layer (not shown) defined using a single damascene process as previously described. A barrier layer 106 is intermediate the dielectric layer and the conductive material at a thickness effective to prevent electromigration of the conductive metal into the dielectric layer. The barrier layer 106 that is within the each of these trench openings has a U-shaped cross section.

In one or more embodiments, liner layers (not shown), such as, for example, cobalt or ruthenium can be positioned between the barrier layer 106 and conductive metal 108. For example, cobalt can be present in thin layers as a liner layer (e.g., 1 to 100 angstroms) between a TaN barrier layer 106 and the conductive metal 108.

The conductive material 108 is at a thickness representing a metal level (Mx) and upper via level (Vx+1) of an interconnect structure, i.e., Mx+Vx+1. As shown, the conductive material 108, barrier layer 106 embedded in the dielectric layer (not shown) are formed on an ultra-low k dielectric material 104 overlaying a cap layer 102.

The initial structure further include a lithographic stack 110, which includes a cap layer 112, an OPL 114, and a patterned photoresist layer 116. The patterned photoresist 116 forms openings that correspond to the portions of the underlying conductive metal 108 that will be recessed to define the height of the conductive metal line (Mx). The remaining photoresist 116 overlies portions of the underlying line of conductive material that correspond to and will subsequently be cut to form the lines ends and form the line end vias. As such, the width of the remaining photoresist 116 overlying this region will be equal to the desired minimum insulator spacing between line ends and the width of the line end vias.

Figure 15:
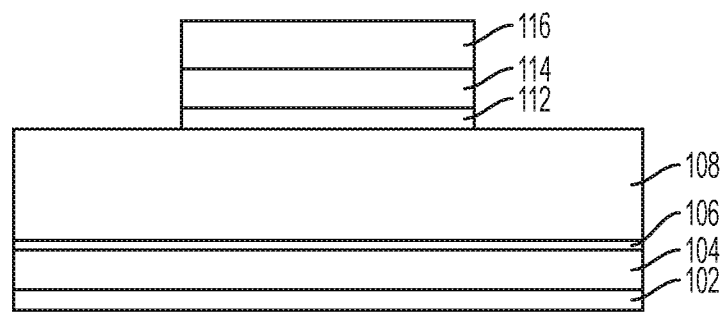
FIG. 15 is a sectional view depicting a semiconductor device after a fabrication operation according to embodiments of the invention.

In FIG. 15, the photoresist pattern is transferred by removing the exposed OPL 114 and cap layer 112 to the conductive metal layer 108 using an etch process as previously described. The etching step can include a dry etching process (including, for example, reactive ion etching, ion beam etching, plasma etching or laser ablation), a wet chemical etching process or any combination thereof.

Figure 16:
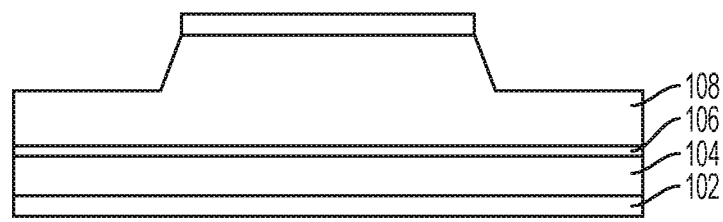
FIG. 16 is a sectional view depicting a semiconductor device after a fabrication operation according to embodiments of the invention.

In FIG. 16, the photoresist layer 116 and the OPL 114 are selectively removed to the cap layer 112 followed by recess of the conductive material 108, which will define the thickness of the line.

Figure 17:
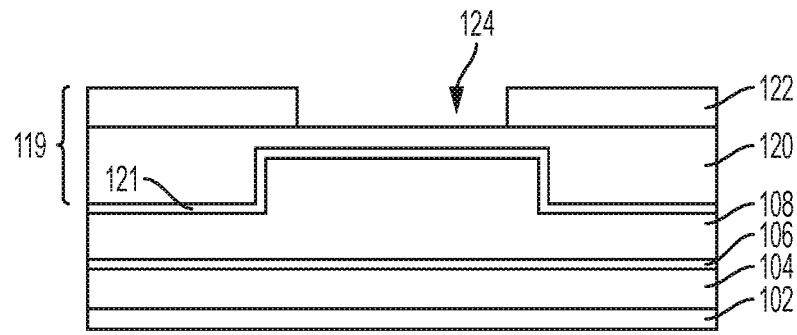
FIG. 17 is a sectional view depicting a semiconductor device after a fabrication operation according to embodiments of the invention.

In FIG. 17, a lithographic patterning stack 119 is deposited onto the substrate to define the tip-to-tip cut line end pattern. The lithographic patterning stack 119 includes conformal deposition of conductive metal cap layer 121, OPL 120, and photoresist layer 122. In one or more embodiments, the conformal cap layer is a bilayer of selectively deposited metal and a non-selective insulator. By way of example, the selective metal can include cobalt, ruthenium, or alloys thereof such as CoTi, and is deposited onto the exposed metal surfaces. The non-selective insulator can be SiCN and overlays the cap layer. The OPL 120 and photoresist are as previous described. The photoresist is patterned to provide an opening 124, which will correspond to the tip-to-tip line end spacing.

Figure 18:
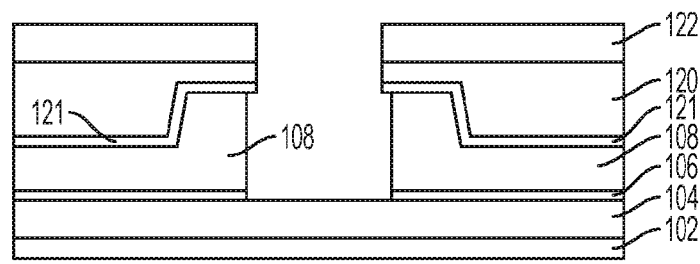
FIG. 18 is a sectional view depicting a semiconductor device after a fabrication operation according to embodiments of the invention.

In FIG. 18, the OPL 120, cap layer 121, and conductive material 108 underlying the opening 124 in the photoresist layer 122 are removed by an etching process to define the vias at the line ends. The pattern transfer can first utilize an ion beam etching process to anisotropically remove the etch metal followed by selective removal of the barrier and liner to the ultra-low k dielectric layer 104 using a wet etch process.

In the anisotropic etching process, the entire structure 100 is exposed/bombarded with a gaseous ion plasma (e.g., Ar, He, Ne, Xe, $N_2$, $H_2$, $NH_3$, $N_2H_2$, etc.) to anisotropically remove the exposed conductive metal. In one or more embodiments, the barrier layer 106 (and liner) are selectively etched using, for example, 15% $H_2O_2$ (hydrogen peroxide)+10 g/L (grams/liter) BTA (Benzotriazole)+0.5 g/L CDTA (cyclohexanediamininetetraaceticacid)+KOH (potassium hydroxide) in deionized (DI) water at a pH in the range of about 4 to about 12. Etching can be performed at a temperatures ranging from about 25° C. to about 70° C. Other possible variations for etch chemistry include, but are not necessarily limited to: (a) replacing KOH by another alkaline metal hydroxide, such as, for example, one of LiOH, NaOH, RbOH, CsOH, and combinations thereof, at concentration ranges of about 0.001M to about 0.1M (molar); (b) replacing hydrogen peroxide by another compound containing one or more peroxy groups, such as, for example, one of perborate salts, percarbonate, urea-hydrogen peroxide, and combinations thereof, at concentration ranges of about 1% to about 20%; (c) replacing CDTA by another peroxide stabilizer, such as, for example, one of diethylenetriaminepenta(methylene-phosphonic acid) (DTPMPA), and ethylenediaminetetraacetic acid (EDTA) at concentration ranges of about 0.1 g/L to about 1 g/L; and (d) replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L.

Figure 19:
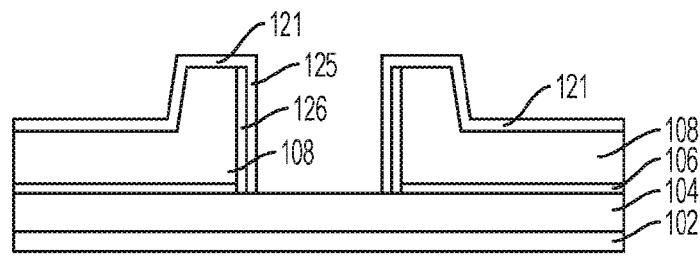
FIG. 19 is a sectional view representative of the structure taken along lines A-A of FIG. 1 depicting a semiconductor device after a fabrication operation according to embodiments of the invention.

In FIG. 19, a chemical vapor deposition process is utilized to selectively provide a metal barrier layer 126 on the exposed sidewalls of the conductive material 108 after pattern transfer followed by conformal deposition of an additional cap layer 125 thereon, wherein cap layer 125 can be of the same material as the cap layer 121. Then metal barrier layer can be a different material than the cap layers 121 or 125. FIG. 19 is representative of the structure depicted in FIG. 1 taken along lines A-A.

Figure 20:
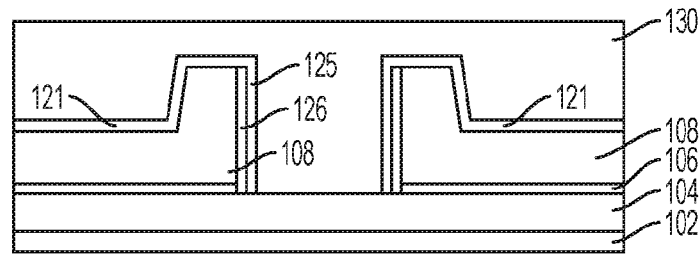
FIG. 20 is a sectional view depicting a semiconductor device after a fabrication operation according to embodiments of the invention.
Figure 21:
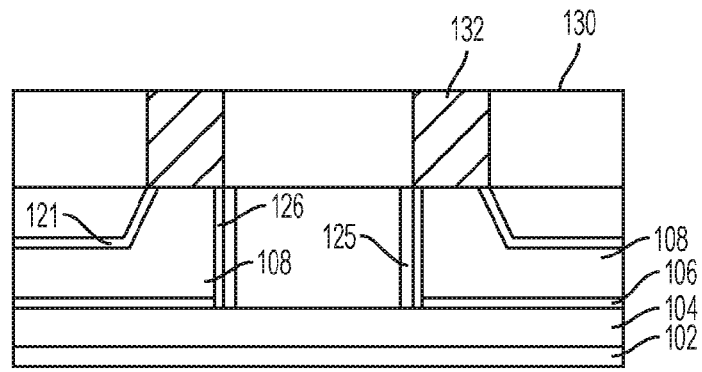
FIG. 21 is a sectional view depicting a semiconductor device after a fabrication operation according to embodiments of the invention.

In FIG. 20, the process flow is continued with deposition of a dielectric layer 130 for forming the next metal line, i.e., the Mx+1 layer. The formation generally includes deposition and patterning of dielectric layer 130, exposing the conductive metal 108 by selectively etching the cap layer 121, and deposition of a conductive material 132 on the exposed conductive metal 108, i.e., the underlying line end vias formed as described above. The resulting structure is shown in FIG. 21. The dielectric layer 130 can be deposited by a flowable CVD process or by spin on techniques depending on the desired dielectric material.

Advantageously, the line end cut defined by the subtractive metal processes minimizes tip to tip MX and Vx+1 spacing and via pitch.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure, comprising:
a single damascene line comprising a first line having a first line end and a second line having a second line end, wherein the first and second lines are linearly arranged relative to one another such that the first line end is spaced apart from the second line end, and wherein the first and second lines are comprised of a conductive material; and
first and second vias comprised of the conductive material and self-aligned at each of the first and second line ends, respectively, wherein sidewalls of the first and second line ends are vertical and contiguous with a corresponding proximal sidewall of the respective vias, wherein sidewalls of the first and second vias opposing the proximal sidewalls comprise sloped sidewalls, and wherein the first and second vias are integral to the first and second lines at the first and second line ends, respectively.

2. The semiconductor device of claim 1, wherein the first and second lines represent an Mx level and the vias represent a Vx+1 level.

3. The semiconductor device of claim 1, wherein the first and second vias have a width equal to a width of the first and second lines, respectively.

4. The semiconductor device of claim 1, further comprising a metal barrier material on sidewalls of the first and second lines and a portion of the sidewalls defining the first and second vias respectively; and a conformal conductive cap layer on the conductive material at line end and the proximal sidewalls of the first and second via, wherein the conformal conductive cap material is different from the metal barrier material.

* * * * *